(12) United States Patent
Sadler (10) Patent No.: US 7,637,411 B2
(45) Date of Patent: *Dec. 29, 2009

(54) WIRE BONDING APPARATUS AND PROCESS

(75) Inventor: Richard D. Sadler, Quakertown, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/198,422

(22) Filed: Aug. 26, 2008

(65) Prior Publication Data

US 2008/0314964 A1    Dec. 25, 2008

Related U.S. Application Data

(63) Continuation of application No. 11/164,980, filed on Dec. 13, 2005, now Pat. No. 7,431,192.

(60) Provisional application No. 60/641,362, filed on Jan. 4, 2005.

(51) Int. Cl.
*B23K 37/04* (2006.01)
*B23K 31/00* (2006.01)

(52) U.S. Cl. .................. 228/4.5; 228/180.5

(58) Field of Classification Search .................. 228/4.5, 228/180.5
See application file for complete search history.

(56) References Cited

U.S. PATENT DOCUMENTS

| | | | | |
|---|---|---|---|---|
| 4,986,460 A | * | 1/1991 | Yamazaki et al. | 228/4.5 |
| 5,951,283 A | * | 9/1999 | Ushiki et al. | 432/253 |
| 5,988,481 A | | 11/1999 | Torihata et al. | |
| 7,431,192 B2 | * | 10/2008 | Sadler | 228/4.5 |
| 2004/0217100 A1 | * | 11/2004 | Ogimoto et al. | 219/243 |

FOREIGN PATENT DOCUMENTS

| | | |
|---|---|---|
| EP | 1098362 A1 | 5/2001 |
| EP | 1313139 A1 | 8/2008 |

OTHER PUBLICATIONS

International Search Report dated May 30, 2006, International Application No. PCT/US2005/045320.

* cited by examiner

*Primary Examiner*—Jessica L. Ward
*Assistant Examiner*—Megha Mehta
(74) *Attorney, Agent, or Firm*—Christopher M. Spletzer, Sr.

(57) ABSTRACT

A wire bonding machine includes (1) a support structure for supporting a work piece and (2) a pre-heat structure for supporting the work piece during a pre-heat operation. The pre-heat structure is moveable with respect to the support structure.

16 Claims, 6 Drawing Sheets

WIRE BONDING APPARATUS AND PROCESS

CROSS-REFERENCE TO RELATED APPLICATIONS

This application is a continuation application, and claims the priority benefit of U.S. patent application Ser. No. 11/164,980 filed Dec. 13, 2005, which claims the priority benefit of U.S. Provisional Application No. 60/641,362, filed Jan. 4, 2005, the contents of which are incorporated herein by reference.

FIELD OF THE INVENTION

The present invention relates to wire bonding equipment used in semiconductor processing. More particularly, the present invention relates to a material handling system component of a wire bonding system.

BACKGROUND OF THE INVENTION

The present invention is an improvement which may be applied to known wire bonding equipment (or new wire bonding equipment) such as the Maxμm™ automatic wire bonder available from Kulicke and Soffa Industries, Inc. of Willow Grove, Pa. Such wire bonding equipment typically includes a material handling system which operates to supply and remove work pieces, or lead frames, to a bonding station having an indexer. During the wire bonding process, the indexer moves each lead frame relative to a bonding head element of the wire bonder.

In conventional wire bonding equipment, the material handling system typically includes at least one magazine handler which holds a stack of lead frames. Lead frames move sequentially from the magazine handler to the bonding station along a support structure including, for example, a pair of rails. The wire bonding process is performed with the lead frame positioned at the bonding station. Following completion of the wire bonding process, the lead frame may be returned to the magazine handler.

Typically, each lead frame is pre-heated prior to the wire bonding process. The preheat process is typically performed with a pre-heat block positioned intermediate the magazine handler and the bonding station. The lead frame is brought into contact with the pre-heat block, and is heated to a temperature of, for example, approximately 160 degrees C. (320 degrees F.). For example, the pre-heat process may take approximately 15 seconds to complete.

In a conventional wire bonder having a single magazine handler, the pre-heat and wire bonding operations are typically performed sequentially, and thus the total processing time for a single lead frame includes both the time for the pre-heat operation and the time for the wire bonding process (which, depending on the number of connections to be formed and the speed of the wire bonding equipment, can vary, for example, over the range of about 37 seconds to about 120 seconds). If it were possible to perform all or part of the pre-heat operation on a first lead frame while simultaneously a second lead frame undergoes the bonding operation, it would be possible to increase the total number of lead frames processed by the wire bonder in a given period of time. However, in conventional wire bonders having a single magazine handler, the return path from the bonding station to the magazine handler (along which the pre-heat block is positioned) is desirably kept clear to allow a lead frame which has completed the wire bonding process to move from the bonding station to the magazine handler without the obstruction of a second lead frame undergoing the pre-heat process. Thus, the pre-heating and wire bonding processes are performed sequentially. It is known to provide two magazine holders with the wire bonder, allowing a first lead frame from the first wire bonder to be pre-heated, while a previously pre-heated second lead frame undergoes the wire bonding process. It would be desirable, however, to provide the improved processing times associated with two magazine holders without incurring the additional cost of a second magazine holder.

BRIEF SUMMARY OF THE INVENTION

According to an exemplary embodiment of the present invention, a wire bonding machine is provided. The wire bonding machine includes (1) a support structure for supporting a work piece, and (2) a pre-heat structure for supporting the work piece during a pre-heat operation. The pre-heat structure is moveable with respect to the support structure.

According to another exemplary embodiment of the present invention, a wire bonding machine is provided. The wire bonding machine includes (1) a magazine handler, (2) a bonding station for wire bonding work pieces, and (3) a material handling system for supplying the work pieces from the magazine handler to the bonding station. The material handling system includes (1) a support structure for supporting a work piece, and (2) a pre-heat structure for supporting a work piece during a pre-heat operation. The pre-heat structure is moveable with respect to the support structure

BRIEF DESCRIPTION OF THE DRAWINGS

For the purpose of illustrating the invention, there is shown in the drawings a form of the invention which is presently preferred; it being understood, however, that this invention is not limited to the precise arrangements and instrumentalities shown. In the drawings.

DETAILED DESCRIPTION OF THE DRAWINGS

According to certain exemplary embodiments of the present invention, a bypass system is provided which simultaneously allows (1) a first work piece to be wire bonded, and (2) a second work piece to be pre-heated. Further, according to certain exemplary embodiments of the present invention, (1) the first work piece (after wire bonding is complete) may be returned to a storage system (e.g., a magazine handler) while (2) the second work piece remains on a pre-heat structure.

Figure 1:
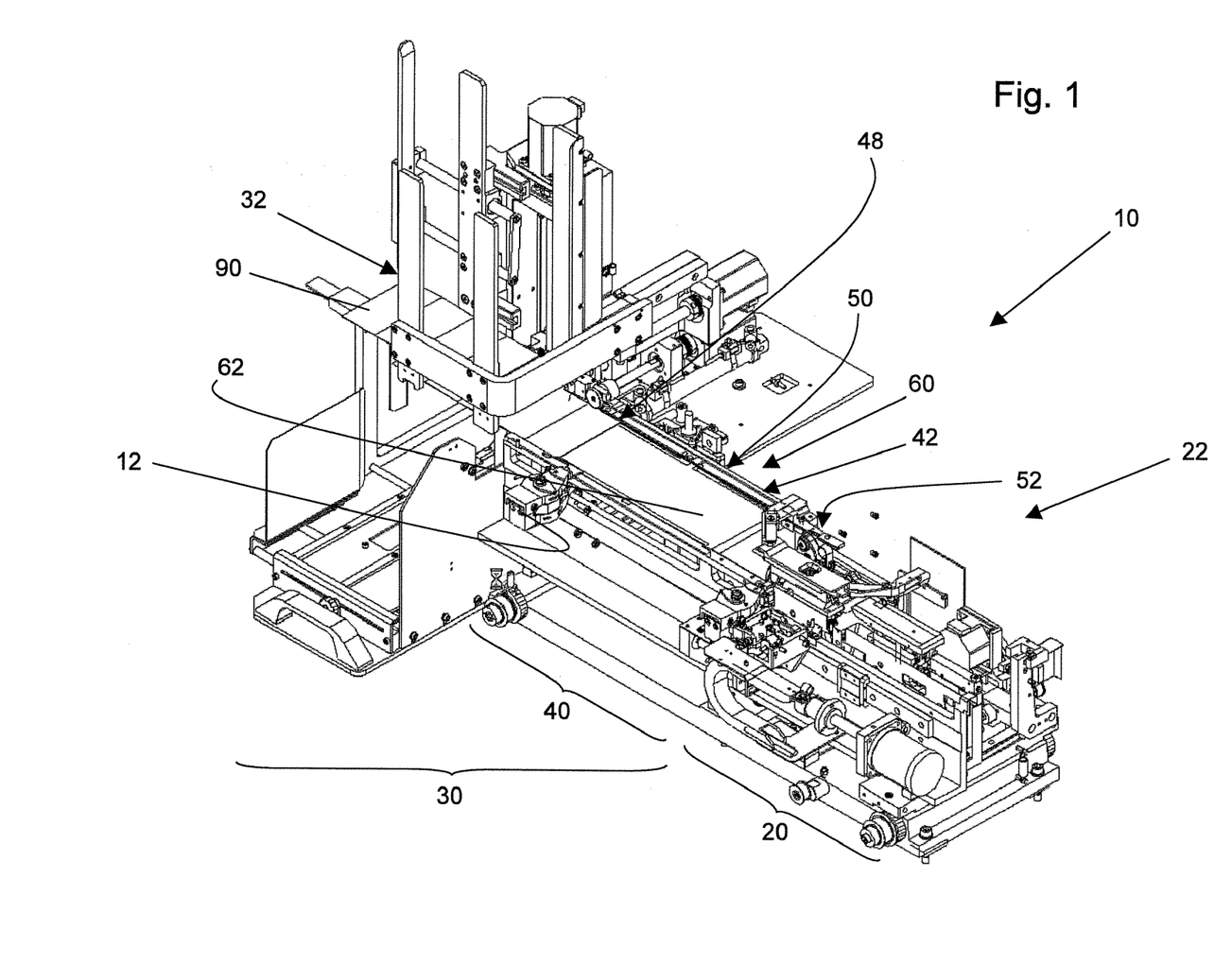
FIG. 1 is perspective view of a portion of a wire bonding apparatus in accordance with an exemplary embodiment of the present invention.

Referring to the drawings, where like numerals identify like elements, there is illustrated in FIG. 1 a portion of a wire bonding apparatus, generally designated by the reference numeral 10. The portion of wire bonding apparatus 10 includes bonding station 20 having indexer 22 and material handling system 30 adapted to supply work pieces to bonding station 20 where the wire bonding operation is performed and to remove the work pieces from bonding station 20 following the wire bonding operation. For example, the work pieces may be lead frames 90, although any other type of work piece is contemplated. Bonding station 20 and lead frames 90 are conventional.

Material handling system 30 includes a conventional work piece holder (e.g., a magazine handler 32 such as that incorporated into the Maxμm™ automatic wire bonder available from Kulicke and Soffa Industries, Inc. of Willow Grove, Pa.). Material handling system 30 further includes conveyor assembly 40 to transport lead frames 90 between magazine handler 32 and bonding station 20. For example, gripper 12 is provided to move lead frames 90 along material handling system 30 to bonding station 20. Conveyor assembly 40 includes support structure 42 functioning to support lead frames 90 during their movement. For example, support structure 42 includes first and second rails 44 and 46 (see FIG. 2B). Support structure 42 includes first, second and third sections, 48, 50 and 52, respectively. First section 48 is at a first end of support structure 42 adjacent magazine handler 32. Third section 52 is at a second end of support structure 42 adjacent bonding station 20. Second section 50 is intermediate first and third sections 48 and 52.

Bypass station 60 is provided as part of conveyor assembly 40. Bypass station 60 is located within second section 50 of support structure 42, that is, intermediate magazine handler 32 and bonding station 20. Bypass station 60 includes movable pre-heat block 62. Pre-heat block 62 is, for example, a resistive heater capable of heating lead frame 90 from room temperature to a fully pre-heated temperature (e.g., approximately 160 deg C. (320 deg F.)) in a time period of, for example, approximately 15 seconds. Pre-heat block 62 has first face 64 upon which lead frame 90 may be positioned in a pre-heating position. With lead frame 90 positioned on first face 64 in the pre-heating position shown (see lead frame 90a in FIG. 2D), heat may be readily transferred from pre-heat block 62 to lead frame 90.

Figure 2A:
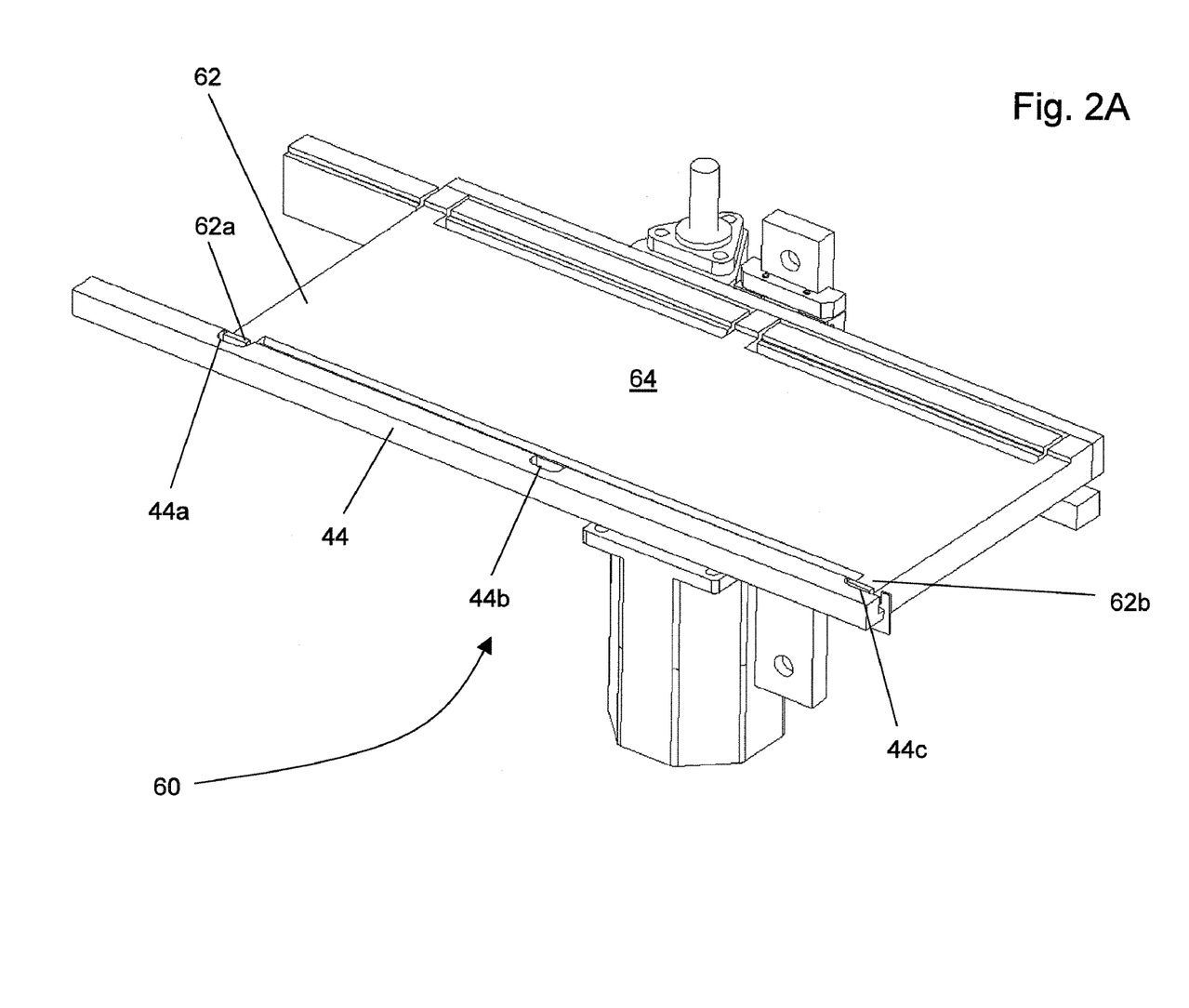
FIG. 2A is a perspective view of a movable pre-heat block of the wire bonding apparatus of FIG. 1, where the moveable pre-heat block is shown in a first position engaged with a support structure.

Referring now to FIG. 2A, bypass station 60 including pre-heat block 62 is illustrated in a first position (a "down" position adjacent rails 44 and 46). In this first position, in the illustrated exemplary embodiment, tabs/ears 62a and 62b are received by apertures 44a and 44c defined by rail 44. Rail 44 also defines aperture 44b which is not used in the illustrated embodiment, but which may also receive another tab/ear of pre-heat block 62 in the first position.

Figure 2B:
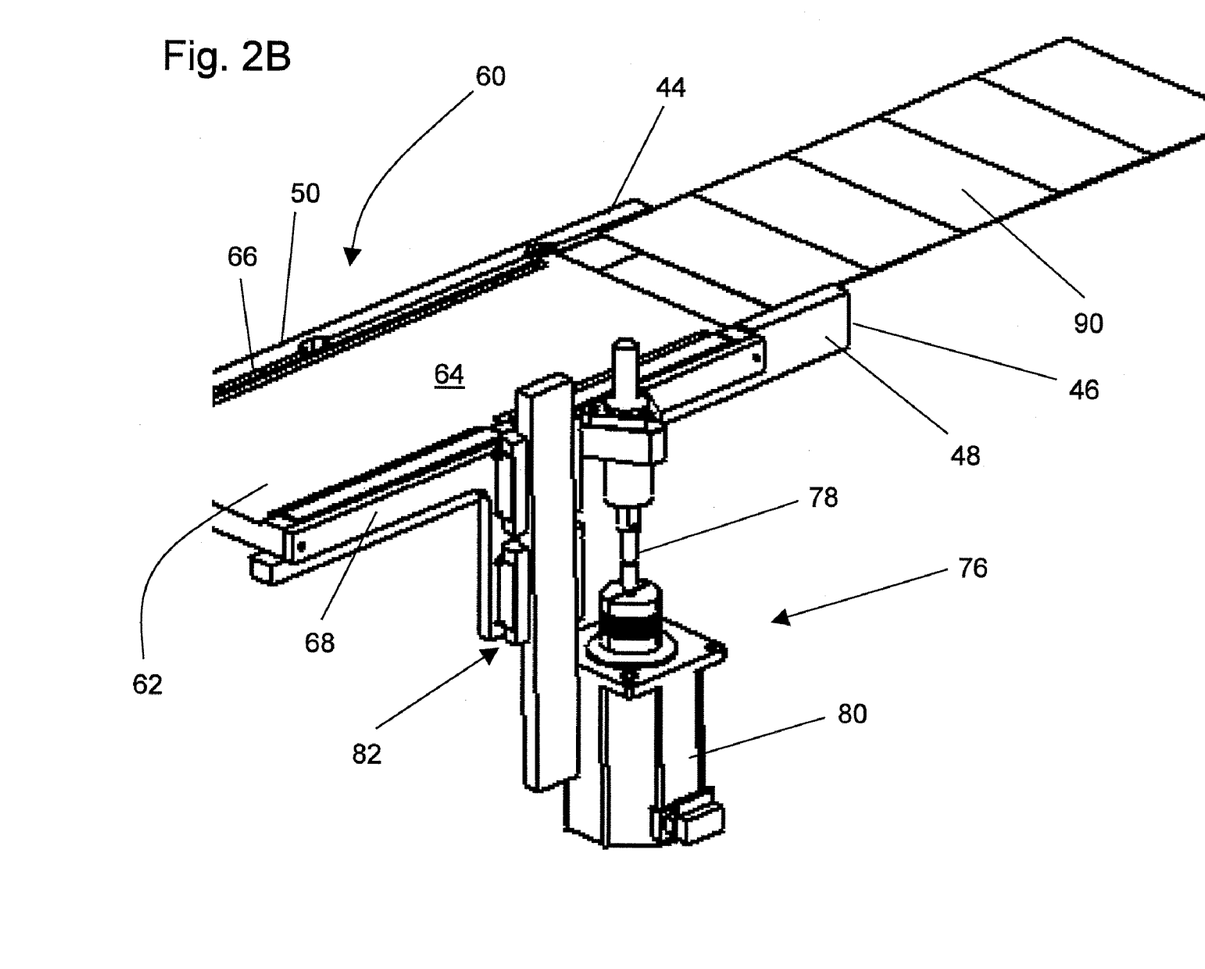
FIG. 2B is another partial perspective view of the movable pre-heat block of FIG. 2A, where a lead frame is shown adjacent the moveable pre-heat block.
Figure 2C:
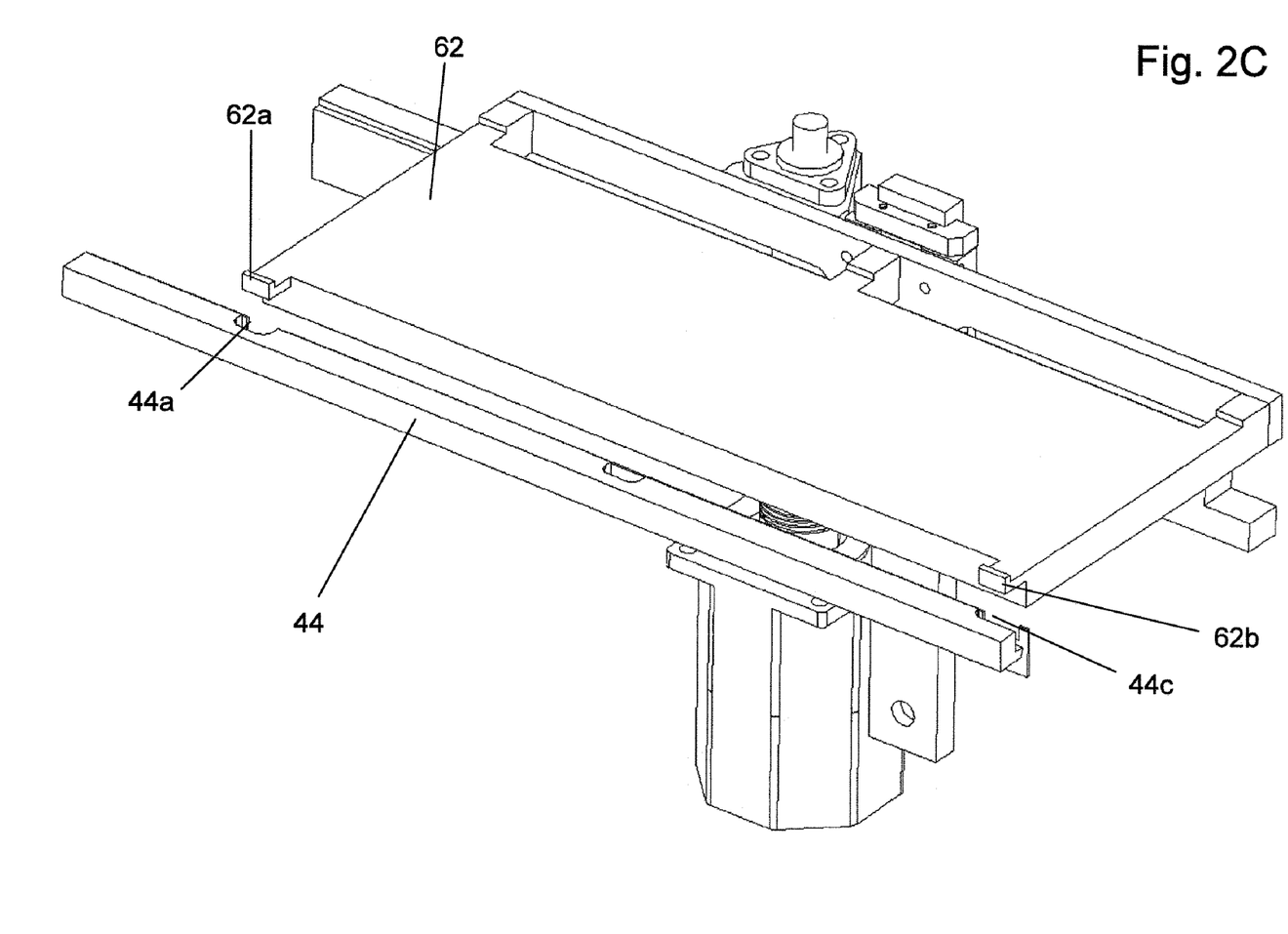
FIG. 2C is another perspective view of the movable pre-heat block of FIG. 2A, where the moveable pre-heat block is shown in a second position raised above the support structure.
Figure 2D:
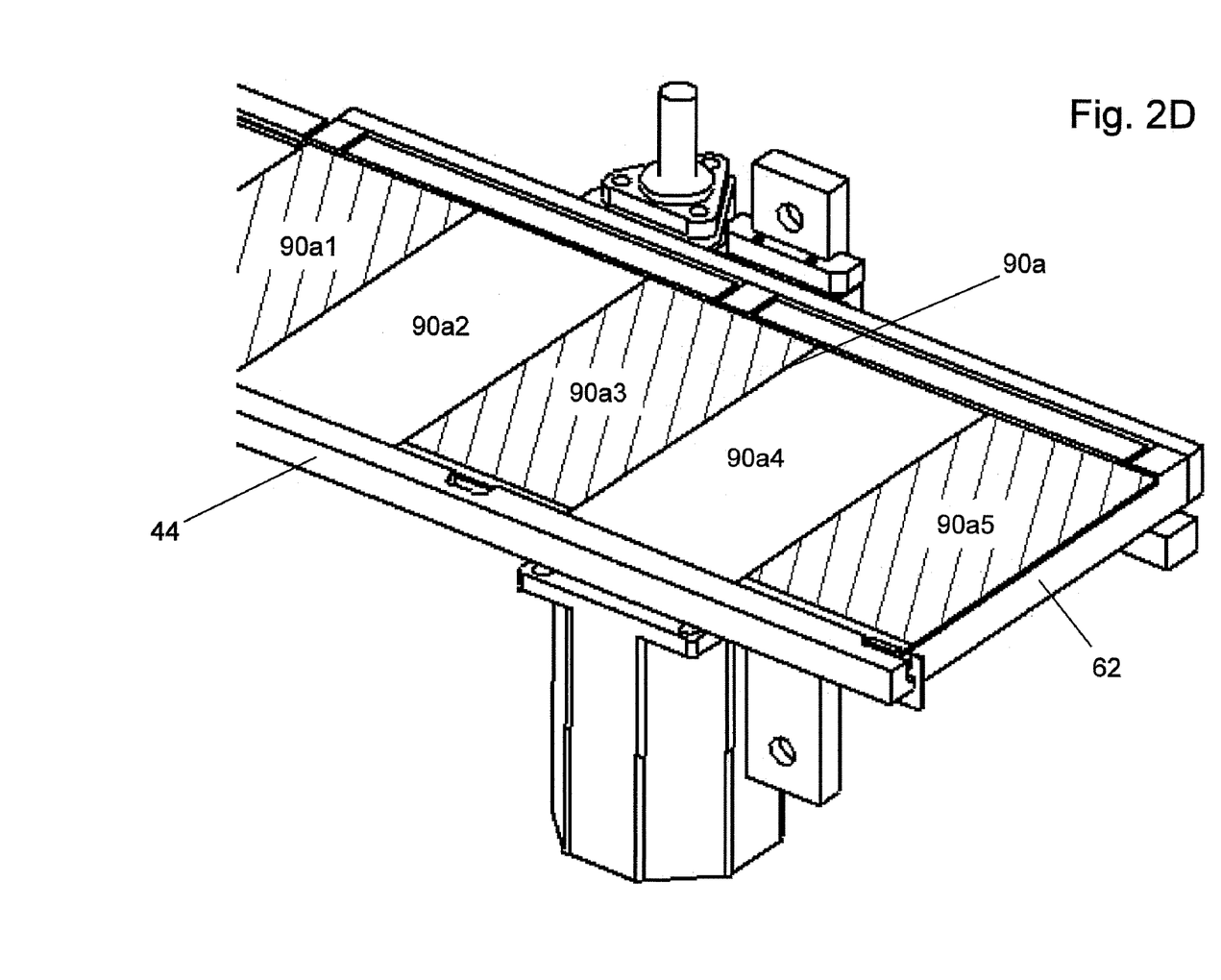
FIG. 2D is another perspective view of the movable pre-heat block of FIG. 2A, where the moveable pre-heat block is shown in the first position supporting a lead frame.
Figure 3:
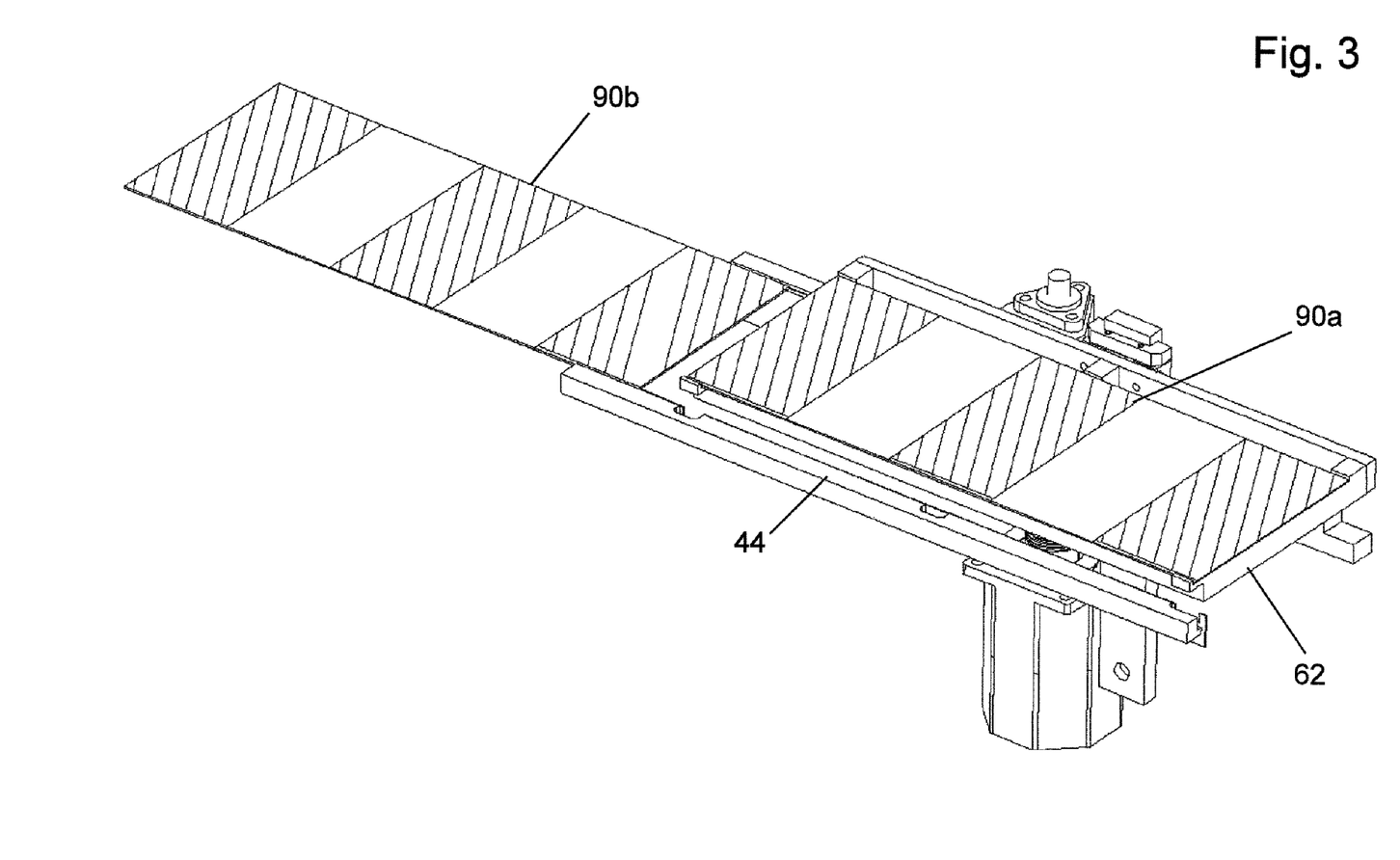
FIG. 3 is another perspective view of the movable pre-heat block of FIG. 2A, where the moveable pre-heat block is shown in the second position raised above the support structure, and a second lead frame is shown adjacent the movable pre-heat block.

Referring now to FIG. 2B, exemplary lead frame 90 is shown traveling toward (or away) from pre-heat block 62 of bypass station 60. Pre-heat block 62 includes first edge 66 and second edge 68. Pre-heat block 62 is sized, and the edges 66, 68 are configured such that pre-heat block 62 is movable relative to first and second rails 44, 46 between (a) a first position adjacent first and second rails 44, 46 as shown in FIGS. 2A, 2B, and 2D, and (b) a second position raised above first and second rails 44, 46 as shown in FIGS. 2C and 3. In the first position, pre-heat block 62 is nested within the rails 44, 46 such that lead frame 90 can travel from first section 48 of support structure 42 into the second section, moving lead frame 90 into the pre-heating position. Similarly, in the first position, lead frame 90 can move from the pre-heating position away from second section 50 and pre-heat block 62 onto third section 52 of support structure 42.

Pre-heat block 62 is moved between the first and second positions, for example, by linear actuator assembly 76 (see FIG. 2B) which translates pre-heat block 62 vertically. Linear actuator assembly 76 includes lead screw 78 operatively coupled to motor 80. Sliding support assembly 82 is connected to pre-heat block 62 and to a remainder of wire bonding apparatus 10 and operates to support and maintain alignment of pre-heat block 62 during movement between the first and second positions. It will be recognized that other conventional types of positioning systems (e.g., air cylinder systems, pneumatic cylinder systems, hydraulic cylinder systems, belt driven systems, etc.) could be substituted for lead screw 78 and motor 80.

Referring now to FIG. 2C, pre-heat block 62 is illustrated in the second position (an "up" position above rails 44 and 46). In this second position, in the illustrated exemplary embodiment, tabs/ears 62a and 62b are removed from apertures 44a and 44c defined by rail 44.

Referring now to FIG. 2D, pre-heat block 62 is illustrated in the first position with an exemplary lead frame 90 (i.e., lead frame 90a) positioned thereon. While any type of work piece is contemplated, exemplary lead frame 90a includes five (5) semiconductor die 90a1, 90a2, 90a3, 90a4, and 90a5.

With reference to FIG. 3, in the second position, pre-heat block 62 is moved away from support structure 42 to allow already wirebonded lead frame 90b to move from bonding station 20 to magazine handler 32 (shown in FIG. 1), bypassing pre-heat block 62. Thus, first lead frame 90a can be undergoing the pre-heat operation with pre-heat block 62 in the second position, while simultaneously second lead frame 90b (e.g., which has completed the wire bonding operation) can move from bonding station 20 back to magazine handler 32.

According to an exemplary operation, with pre-heat block 62 in the first position, first lead frame 90a which is to undergo the wire bonding operation moves from magazine handler 32, over support structure first section 48 to support structure second section 50 into the pre-heating station. Pre-heat block 62 is then translated upward into its second position, and first lead frame 90a undergoes the pre-heat operation. While pre-heat block 62 is in the second position, second lead frame 90b which has previously undergone the pre-heat operation and which has also completed the wire bonding operation moves from bonding station 20 across the third section 52, through the second section 50 (and under pre-heat block 62), and then through first section 48 as it returns to magazine handler 32. With second lead frame 90b clear of second section 50, pre-heat block 62 is moved (e.g., lowered) from the second position to the first position. First lead frame 90, now fully pre-heated, is then translated away from pre-heat block 62 and second section 50, across third section 52 of support structure 42 and into position at bonding station 20 for the wire bonding operation. Simultaneously with movement of first lead frame 90a into bonding station 20, a third lead frame 90 (not shown) may be moved from magazine handler 32, across first section 48 and into the pre-heating station at second section 50. Thus, the wire bonding operation and the pre-heat operations may be carried out at least, in part, simultaneously, rather than sequentially as is the case for a conventional wire bonder having a single magazine handler. Thus, a significant amount of time is saved in comparison to conventional techniques.

Therefore, a novel wire bonder apparatus and associated wire bonding process are thus described which provide improved processing efficiency for a wire bonder equipped with, for example, a single magazine holder.

Although the present invention has been illustrated and described primarily with respect to a single bond head wire bonding machine, it is contemplated that the teachings disclosed herein may be applied a multi-bond head machine (e.g., a dual bond head wire bonding machine). In such a configuration, for example, each bond head may be configured with a bypass station (and its own magazine handler) such as those described herein.

Although the present invention has been illustrated and described primarily with respect to a moveable pre-heat structure (e.g., pre-heat block 62) which moves vertically away from a support structure, it is not limited thereto. For example, in certain configurations, it is contemplated that alternative motions may be utilized such as (1) lowering the pre-heat structure away from the support structure, (2) moving the pre-heat structure to a side of the support structure, (3) moving the pre-heat structure up and then to a side of the support structure, as well as many other potential motion paths.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed:

1. A wire bonding machine comprising:
 a support structure for supporting a work piece, the support structure extending along a path of work pieces of the wire bonding machine;
 a pre-heat station including a pre-heat structure for supporting and heating the work piece during a pre-heat operation, the pre-heat structure being moveable with respect to the support structure such that the pre-heat structure is configured to be moved away from the path; and
 a wire bonding station including a surface for supporting the work piece during a wire bonding operation following the pre-heat operation, the bonding station being distinct from the pre-heat station,
 wherein the pre-heat structure is configured to be raised above the support structure such that another work piece, already wire bonded, may be returned, along the support structure, from (1) the wire bonding station of the wire bonding machine to (2) a magazine handler of the wire bonding machine by passing underneath the pre-heat structure while the pre-heat structure supports and heats the work piece during the pre-heat operation.

2. The wire bonding machine of claim 1 wherein the support structure is configured to support the work piece during at least a portion of a motion between the magazine handler and the wire bonding station.

3. The wire bonding machine of claim 2 further comprising a gripper for providing the portion of the motion between the magazine handler and the wire bonding station.

4. The wire bonding machine of claim 1 further comprising a vertical actuator for raising the pre-heat structure above the support structure.

5. The wire bonding machine of claim 4 wherein the vertical actuator comprises at least one of an air cylinder, a pneumatic cylinder, a hydraulic cylinder, a belt drive, and a lead screw.

6. A wire bonding machine comprising:
 a support structure for supporting a work piece, the support structure extending along a path of work pieces of the wire bonding machine;
 a pre-heat station including a pre-heat structure for supporting and heating the work piece during a pre-heat operation, the pre-heat structure being moveable with respect to the support structure such that the pre-heat structure is configured to be moved away from the path; and
 a wire bonding station including a surface for supporting the work piece during a wire bonding operation following the pre-heat operation, the bonding station being distinct from the pre-heat station,
 wherein the support structure comprises at least one rail, the at least one rail defining at least one alignment aperture, and wherein the pre-heat structure includes at least one tab configured to be received by the at least one alignment aperture when the pre-heat structure is positioned adjacent the support structure.

7. The wire bonding machine of claim 1 wherein the wire bonding machine comprises a single one of the magazine handler.

8. The wire bonding machine of claim 1 wherein the wire bonding machine comprises (1) a first one of the magazine handler configured to provide work pieces to the pre-heat structure and the wire bonding station, and (2) a second one of the magazine handler configured to provide work pieces to a second pre-heat structure and a second wire bonding station.

9. The wire bonding machine of claim 1 wherein the pre-heat structure is a pre-heat block configured to be moved between (1) a first position adjacent the support structure, and (2) a second position above the support structure.

10. A wire bonding machine comprising:
 a magazine handler;
 a wire bonding station for wire bonding work pieces; and
 a material handling system for supplying the work pieces from the magazine handler to the wire bonding station, the material handling system including (1) a support structure for supporting a work piece, the support structure extending along a path of work pieces of the wire bonding machine, (2) a pre-heat station including a pre-heat structure for supporting and heating a work piece during a pre-heat operation, the pre-heat structure being moveable with respect to the support structure such that the pre-heat structure is configured to be moved away from the path, and (3) the wire bonding station including a surface for supporting the work piece during a wire bonding operation following the pre-heat operation, the wire bonding station being distinct from the pre-heat station, wherein the pre-heat structure is configured to be raised above the sup ort structure such that another work piece, already wire bonded, may be returned, along the support structure, from (1) the wire bonding station to (2) the magazine handler by passing underneath the pre-heat structure while the pre-heat structure supports and heats the work piece during the pre-heat operation.

11. The wire bonding machine of claim 10 further comprising a gripper for providing a portion of a motion of a work piece between the magazine handler and the wire bonding station.

12. The wire bonding machine of claim 10 further comprising a vertical actuator for raising the pre-heat structure above the support structure.

13. The wire bonding machine of claim 12 wherein the vertical actuator comprises at least one of an air cylinder, a pneumatic cylinder, a hydraulic cylinder, a belt drive, and a lead screw.

14. A wire bonding machine comprising:

a magazine handler;

a wire bonding station for wire bonding work pieces; and a material handling system for supplying the work pieces from the magazine handler to the wire bonding station, the material handling system including (1) a support structure for supporting a work piece, the support structure extending along a path of work pieces of the wire bonding machine, (2) a pre-heat station including a pre-heat structure for supporting and heating a work piece during a pre-heat operation, the pre-heat structure being moveable with respect to the support structure such that the pre-heat structure is configured to be moved away from the path, and 3 the wire bonding station including a surface for supporting the work piece during a wire bonding operation following the pre-heat operation, the wire bonding station being distinct from the pre-heat station, wherein the support structure comprises at least one rail, the at least one rail defining at least one alignment aperture, and wherein the pre-heat structure includes at least one tab configured to be received by the at least one alignment aperture when the pre-heat structure is positioned adjacent the support structure.

15. The wire bonding machine of claim 10 wherein the wire bonding machine comprises (1) another magazine handler configured to provide work pieces to a second pre-heat structure and a second wire bonding station.

16. The wire bonding machine of claim 10 wherein the pre-heat structure is a pre-heat block configured to be moved between (1) a first position adjacent the support structure, and (2) a second position above the support structure.

* * * * *